(12) United States Patent
Cerio, Jr. et al.

(10) Patent No.: US 7,642,201 B2
(45) Date of Patent: Jan. 5, 2010

(54) SEQUENTIAL TANTALUM-NITRIDE DEPOSITION

(75) Inventors: Frank M. Cerio, Jr., Albany, NY (US); Shigeru Mizuno, Delmar, NY (US); Tsukasa Matsuda, Gyeonggi-do (KR); Adam Selsey, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 20 days.

(21) Appl. No.: 12/018,813

(22) Filed: Jan. 24, 2008

(65) Prior Publication Data

US 2009/0191721 A1    Jul. 30, 2009

(51) Int. Cl.
*H01L 21/31* (2006.01)

(52) U.S. Cl. .................. 438/785; 257/E21.24

(58) Field of Classification Search .................. 438/785; 257/E21.24
See application file for complete search history.

(56) References Cited

U.S. PATENT DOCUMENTS

| | | | |
|---|---|---|---|
| 2005/0211545 A1* | 9/2005 | Cerio et al. | 204/192.3 |
| 2005/0224979 A1* | 10/2005 | Marathe et al. | 257/758 |
| 2006/0213764 A1* | 9/2006 | Cerio, Jr. | 204/192.12 |
| 2007/0152333 A1* | 7/2007 | Lee | 257/751 |

* cited by examiner

*Primary Examiner*—W. David Coleman
*Assistant Examiner*—Christine Enad

(57) ABSTRACT

An iPVD system is programmed to deposit uniform material, such as barrier material, into high aspect ratio nano-size features on semiconductor substrates using a multi-step process within a vacuum chamber which enhances the sidewall coverage compared to the field and bottom coverage(s) while minimizing or eliminating overhang.

20 Claims, 9 Drawing Sheets

SEQUENTIAL TANTALUM-NITRIDE DEPOSITION

FIELD OF THE INVENTION

The invention relates to the metallization of via and trench structures on semiconductor substrates. More particularly, the invention relates to the metallization of high aspect ratio via and trench structures of silicon substrates utilizing ionized sputtered materials to form Tantalum (Ta)-containing barrier and/or seed layers on the substrates.

BACKGROUND OF THE INVENTION

In the metallization of high aspect ratio vias and trenches on semiconductor substrates, it is required that the barrier and seed layer have good sidewall coverage.

Ionized Physical Vapor Deposition (IPVD) is used for barrier and seed layer metallization in advanced IC substrates. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Accordingly, there is a need to further control step coverage of the metal or the overhang that typically develops during the deposition step.

SUMMARY OF THE INVENTION

The invention provides a method of operating a deposition system to perform sequential tantalum-nitride deposition sequence comprising one or more Low Net Deposition (LND) processes and one or more No Net Deposition (NND) processes.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION

Figure 1:
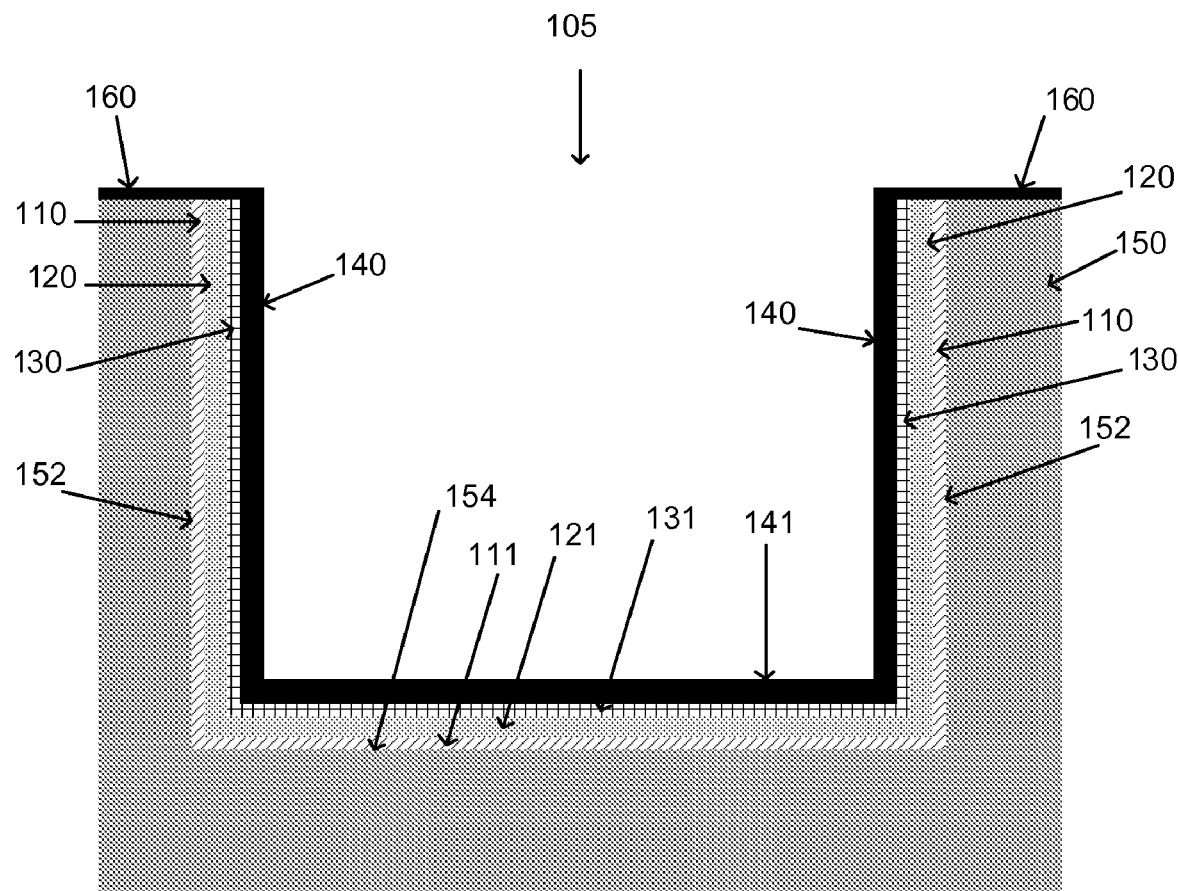
FIG. 1 illustrates a simplified view of a substrate cross-section in accordance with an embodiment of the invention.

The invention provides a method of operating an ionized physical vapor deposition (iPVD) system to deposit barrier layer material into nanometer features on a patterned substrate on a substrate holder within a processing chamber in the iPVD system. In some embodiments, a four-step procedure can be performed at lower temperatures, and the procedure can include one or more Low Net Deposition (LND) iPVD processes and one or more No Net Deposition (NND) iPVD process.

For example, the LND process can be characterized by a deposition rate between approximately +5 nanometers per minute and approximately +15 nanometers per minute in the field area of the substrate, and the NND process can be characterized by a deposition rate between approximately −5 nanometers per minute and approximately +5 nanometers per minute in the field area of the substrate. During the four-step procedure, process parameters are adjusted to establish an ultra-low deposition rate in a field area of the patterned substrate. The method may also be used, for example, to repair a barrier.

The field area refers to the upper surface of the substrate being processed and is the surface into which the high aspect ratio vias and trenches extend. An ultra-low deposition rate as referred to herein as a deposition rate of less than about 15 nanometers per minute in the field area.

An iPVD processing system can be used for the barrier deposition processes. These processes can be typically performed in the vacuum processing chamber of an iPVD apparatus in which the substrate to be coated is held on a support. A high-density plasma is maintained in the chamber in a processing gas, which can be, for example, an inert gas into which metal or other coating material vapor has been introduced, usually by sputtering. The high-density plasma is usually ionized by coupling RF energy into the process gas, often by an inductive coupling from outside of the chamber. The RF energy ionizes both the process gas and a fraction of the coating material, which may be to a low plasma potential of only a few volts, but may be higher. The processing gas and the ionized coating material can then be directed onto the substrate by control of the bias on the substrate, to coat and not etch the substrate. For the LND processes of the present invention, an iPVD process is run, but with the deposition rates reduced as explained in the examples below. The parameters of the iPVD process are controlled to produce the LND result on the plasma-facing surface of the substrate, or field area of the substrate. When so controlled, the iPVD process produces the desired result of deposition of a barrier layer or a seed layer, without producing overhangs around the feature openings.

Exemplary embodiments of the method of the invention are described below, which disclose a deposition technique for use with an iPVD system to metallize high aspect ratio vias and trenches by depositing ionized metal with a flux to the field area surface of the substrate that produces a flux to the sidewall of the feature. This technique does not rely on an etch sequence to control the conformality of the metal. The deposition process is such that the overhang or overburden is eliminated or minimized, reducing the reliance on or need for the etch step as an overhang control. In various embodiments, the process involves depositing a thin layer of a barrier metal such as Ta or TaN. For example, the barrier deposition process can be followed by a seed layer process and/or a dry-filling process in which a metal such as copper is used.

This invention is distinctly different from prior art which teaches high DC powers with high RF bias powers for increased conformality or the case where several deposition and etch steps are performed within or in different vacuum chambers. This barrier deposition process is characterized by very low deposition rates. For example, the DC power can be reduced to reduce the deposition rate to less than 10 nm/min. Additionally, a range of RF substrate biases can be applied to the substrate during the barrier deposition process.

FIG. 1 illustrates a simplified view of a substrate cross-section in accordance with an embodiment of the invention. In the illustrated layout 100, a feature 105 is shown having a first sidewall film layer 110 deposited on the sidewalls 152 of the feature 105, and having a first bottom film layer 111 deposited on the bottom 154 of the feature 105. A second sidewall film layer 120 is illustrated adjacent to the first sidewall film layer 110 on the sidewalls 152 of the feature 105, and a second bottom film layer 121 is illustrated adjacent to the first bottom film layer 111. A third sidewall film layer 130 is illustrated adjacent to the second sidewall film layer 120 on the sidewalls 152 of the feature 105, and a third bottom film layer 131 is illustrated adjacent to the second bottom film layer 121 at the bottom of the feature 105. In addition, a fourth sidewall film layer 140 is illustrated adjacent to the third sidewall film layer 130 on the sidewalls 152 of the feature 105, and a fourth bottom film layer 141 is illustrated adjacent to the third bottom film layer 131 at the bottom of the feature 105.

In some cases, the layer thicknesses at the bottom of the feature 105 may be thicker than the layer thickness on the sidewalls of the feature 105. In other cases, the bottom and sidewall thicknesses may be substantially the same. The method of the invention provides a substantially conformal deposition of barrier material on the sidewalls and the bottom of the feature 105.

In various embodiments, the layer material in the feature 105 can include compounds comprising tantalum (Ta), titanium, (Ti), ruthenium (Ru), iridium (Ir), aluminum (Al), silver (Ag), platinum (Pt), or copper (Cu), or a combination thereof. For example, TaN material can deposited, the Nitrogen/Tantalum (N/Ta) ratio and the TaN layer thicknesses can be controlled during an IPVD process to obtain the best performance with respect to etch resistance, copper diffusion, conformality, and resistivity. In addition, the Nitrogen/Tantalum (N/Ta) ratio and the thickness of the layer can be controlled during an IPVD process to reduce nanoporosity and to maintain an amorphous microstrucure. The sequence of depositing highly nitrided (N/Ta>0.4) material using a low bias high ionization IPVD process with lower nitrided (N/Ta<0.2) material using a re-sputter lower ionization IPVD process results in film with high average nitridation for Cu diffusion barrier enhancement and low crystallinity amorphous like film with very small (tight) grain boundaries to eliminate bulk and grain boundary diffusion of oxygen which can result in stress induced voiding and corrosion of the Cu. Additionally the deposition temperature can be decreased to below room temperature (RT) to reduce the crystallinity of the film and improve the oxidation barrier performance.

In various embodiments, one or more Ta-containing layers can be deposited into features having critical dimensions less than 50 nm. In addition, the feature 105 can include substantially straight and/or tapered sidewalls. The inventor believes that the methods and apparatus of the present invention can be used to deposit Ta-containing barrier and/or seed layers at the 65 nm node, the 45 nm node, and the 32 nm node. In addition, the inventor believes that the methods and apparatus of the present invention can be used to deposit TaN spacer layers on metallic gate structures at the 65 nm node, the 45 nm node, and the 32 nm node. Alternatively, one or more barrier and/or seed layers may be deposited into trenches and/or dual damascene features.

Figure 2A:
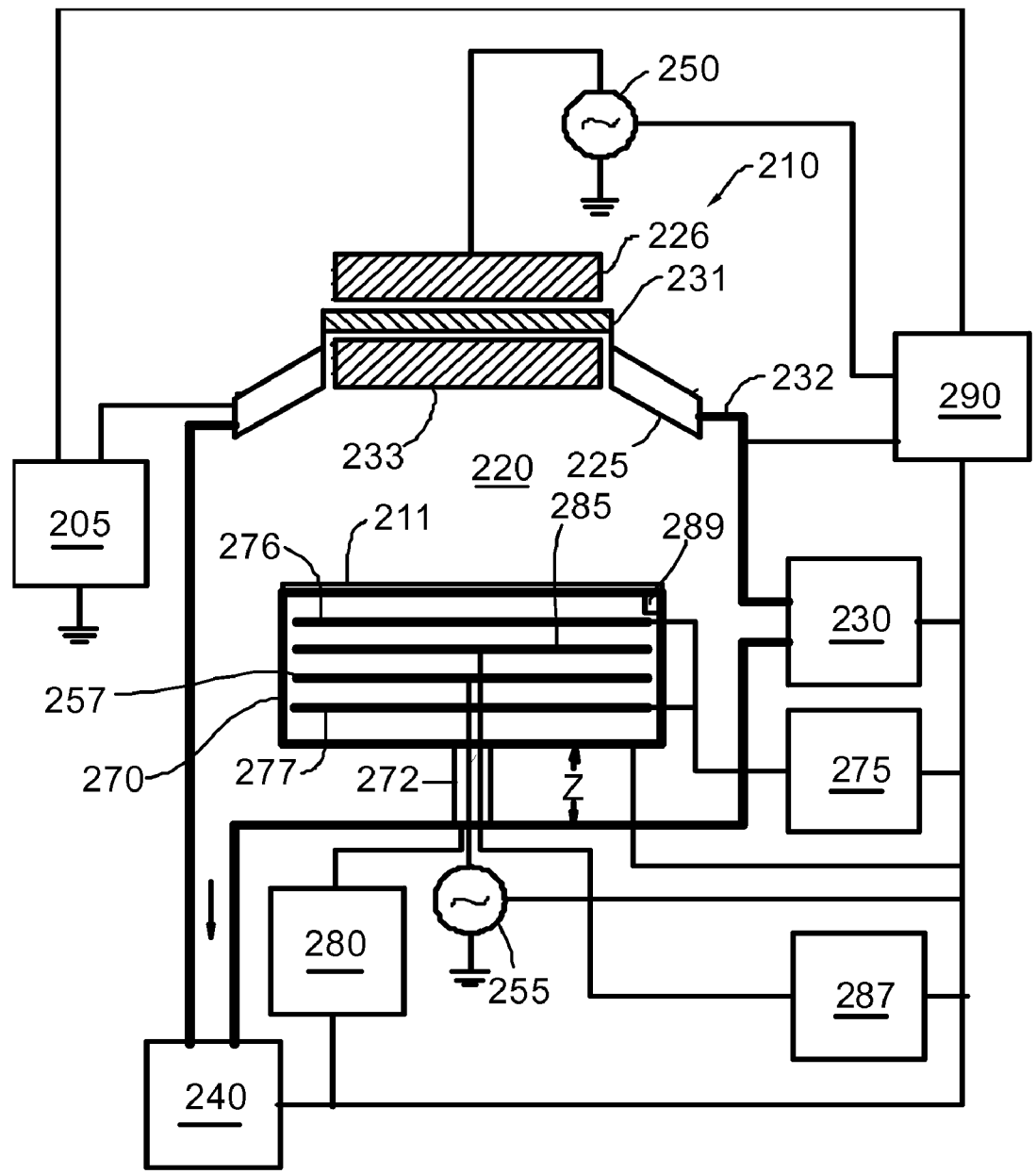
FIG. 2A illustrates an exemplary block diagram of a processing system according to an embodiment of the invention.

FIG. 2A illustrates an exemplary block diagram of a processing system according to an embodiment of the invention. In the illustrated embodiment, an iPVD system 200A is shown.

The IPVD system 200A can comprise an iPVD processing module 210, a DC source 205 coupled to a target 225 that is coupled to the processing chamber 220, a process gas supply system 230 that can be coupled to processing chamber 220, a pressure control system 240 that can be coupled to the processing chamber 220, a RF generator 250 that can be coupled to the processing chamber 220, a RF bias generator 255 that can be coupled to an electrode 257 in the temperature-controlled substrate holder 270, a backside gas supply system 280 that can be coupled to the temperature-controlled substrate holder 270, and an ESC control unit 287 coupled to the ESC 285.

The IPVD system 200A comprises a controller 290 coupled to the processing chamber 220, coupled to the DC source 205, coupled to the gas supply system 230, coupled to the pressure control system 240, coupled to the RF generator 250, coupled to the RF bias generator 255, coupled to the temperature-controlled substrate holder 270, coupled to the temperature control system 275, coupled to the backside gas supply system 280, and coupled to the Electrostatic Chuck (ESC) control unit 287.

The IPVD processing module 210 further comprises an antenna 226, a window 231 coupled to the antenna, a louvered deposition baffle 233 coupled to the window, and the target 225 coupled to the processing chamber 220. RF power can be supplied to the antenna 226 from the RF generator 250, and can be used to create an inductively coupled plasma (ICP) in the chamber 220.

The antenna 226 can be electrically connected using a RF matching network (not shown) to the RF generator, and the antenna 226 can be selectively energized by the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of iPVD systems are described in U.S. Pat. Nos. 6,287,435; 6,080,287; 6,197,165 and 6,132,564, and these patents are hereby expressly incorporated herein by reference.

In one embodiment, a controllable backside pressure can be established that allows the apparatus controller 290 the relative influence of the backside pressure on the respective process steps differently, depending on the process parameters. This may include variable backside pressures or flexible duty cycles.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna can be switched between different power levels during the different steps in a barrier deposition process.

The IPVD system 200A can also comprise a temperature-controlled substrate holder 270 that can include an electrostatic chuck 285 and can be coupled to the processing chamber using a Z-motion drive 272. The Z-motion drive 272 can be used to adjust the substrate-to-source distance to provide the best deposition uniformity. The controller 290 can be used to determine the gap size required during the barrier deposition process and provide the control data to the Z-motion drive 272 when it is required. During a barrier deposition process, the substrate-to-source distance can typically be 150 to 300 mm.

The temperature-controlled substrate holder 270 can accommodate a 200 mm substrate, a 300 mm substrate, or a larger substrate. For example, substrate 211 can be transferred into and out of processing chamber 220 through an opening (not shown) that is controlled by a gate valve assembly (not shown). In addition, substrate 211 can be transferred on and off the temperature-controlled substrate holder 270 using a robotic substrate transfer system (not shown). In addition, substrate 211 can be received by substrate lift pins (not shown) housed within temperature-controlled substrate holder 270 and mechanically translated by devices housed therein. Once the substrate 211 is received from the transfer system, it can be lowered to an upper surface of the temperature-controlled substrate holder 270.

During processing, a substrate 211 can be held in place on top of the temperature-controlled substrate holder 270 using an electrostatic chuck 285. Alternately, other clamping means may be used.

In addition, the substrate temperature can be controlled when the substrate is on the temperature-controlled substrate holder 270. The temperature-controlled substrate holder 270 can include a heater assembly 276 and a cooling assembly 277 that can be coupled to the temperature control system 275. The heater assembly 276 and the cooling assembly 277 can be used along with one or more backside gasses to establish the correct substrate temperature. The temperature of the substrate 211 can be controlled to obtain the best feature and/or via metallization. The controller 290 can be used to determine and control the substrate temperature. For example, the cooling assembly 277 may include fluid passages (not shown) in the temperature-controlled substrate holder 270 and the appropriate temperature controls.

The thermal conductivity between the temperature-controlled substrate holder 270 and the substrate 211 can be controlled by providing backside gas between the substrate 211 and the temperature-controlled substrate holder 270. Process parameters can be controlled during the barrier deposition process to ensure that the metal deposited in the features and/or via structures is uniform. For example, heat generated in the substrate 211 during plasma processing can be extracted efficiently by the temperature-controlled substrate holder 270 to keep the temperature of the substrate 211 at a substantially constant temperature, or the heat can be used to increase the substrate temperature.

Gas channels (not shown) can be used to direct a backside (heat transfer) gas, such as helium or argon, between the top of the temperature-controlled substrate holder 270 and the facing surface of the substrate 211. For example, a two-zone system may be used to establish different and independent backside pressure values for a center portion and an edge portion, thereby providing a different thermal conductivity between the substrate holder and different portions of the substrate.

The backside gas can be used to control the transfer of heat energy between the temperature-controlled substrate holder 270 and substrate 211 by providing an efficient heat transfer medium. The electrostatic chuck 285 can also be used to control the transfer of heat between the substrate 211 and temperature-controlled substrate holder 270. For example, the electrostatic force can be made approximately uniform to cause a significant portion of the facing surface of the substrate 211 to physically contact the top surface of the temperature-controlled substrate holder 270 and to contact the top surface of the temperature-controlled substrate holder 270 with a substantially uniform force. The electrostatic force can also be controlled to limit the leakage of heat transfer gas from beneath the substrate 211 when the backside gas pressure changes, thereby maintaining a controlled backside gas pressure and providing the correct thermal conductivity between the substrate 211 and the temperature-controlled substrate holder 270.

One or more temperature sensors 289 can be positioned at one or more locations on or within the temperature-controlled substrate holder 270 and can be coupled to the controller 290 that converts signals from the temperature sensors 289 to provide an indication of the temperature of different portions of temperature-controlled substrate holder 270. The temperature of the temperature-controlled substrate holder 270 can be used to determine the temperature of the substrate 211 and the controller 290 can provide feedback information to the temperature control system 275 and the backside gas supply system 280 for regulating the temperature of substrate 211.

For example, the backside gas can be supplied at a pressure in a range from approximately zero Torr to approximately 25 Torr, and the backside gas can apply a force to the substrate 211 due to the pressure differential between the backside gas pressure and the pressure within the vacuum processing chamber 220 which can vary during processing between about 5 mTorr and about 500 mTorr. The force applied by the backside gas acts to displace the substrate 211 from the temperature-controlled substrate holder 270, and to counteract this force, a clamping voltage can be applied to the electrostatic chuck 285 to establish an attractive electrostatic force of a magnitude sufficient to secure the substrate 211 to the temperature-controlled substrate holder 270.

RF bias power can be supplied to an electrode 257 in the temperature-controlled substrate holder 270 using the RF bias generator 255, and can be used to provide a substrate bias. The controller 290 can be used to determine the amount of RF bias power to provide and when to have it applied to the temperature-controlled substrate holder 270. For example, RF bias power can be turned on to a level appropriate during barrier deposition processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate 211. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternately, the RF bias generator 255 may be omitted from the processing system and the substrate holder 270 may be either grounded or electrically floating. Alternately, other frequencies can be used, such as 2 MHz or 27 MHz.

Process gas can be provided to the processing chamber 220 by the gas supply system 230. The process gas can comprise a nitrogen-containing gas, or an inert gas, or a combination thereof. The inert gas may be argon, which is often used, but may also be any other inert gas or may be a non-inert gas that is compatible with the process.

Chamber pressure can be controlled using the pressure control system 240. The chamber pressure can be maintained at a low pressure by the pressure control system 240. The controller 290 can be used to control the pressure control system 240, and/or the gas supply system 230 and can be used to control the chamber pressure.

DC power can be supplied from DC source 205 to the target 225. The controller 290 can be used to determine the amount of DC power to provide and when to have it applied to the target.

The controller 290 can be configured to provide control data to the system components and receive process and/or status data from the system components. In addition, the controller 290 may be coupled to another control system (not shown), and can exchange information with the other control system. For example, the controller 290 can comprise a microprocessor, a memory (e.g., volatile or non-volatile memory), and a digital I/O port capable of generating control voltages sufficient to communicate and activate inputs to the iPVD system 200A as well as monitor outputs from the IPVD system 200A. Moreover, the controller 290 can exchange information with the system components, and a program stored in the memory can be utilized to control the aforementioned components of an iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
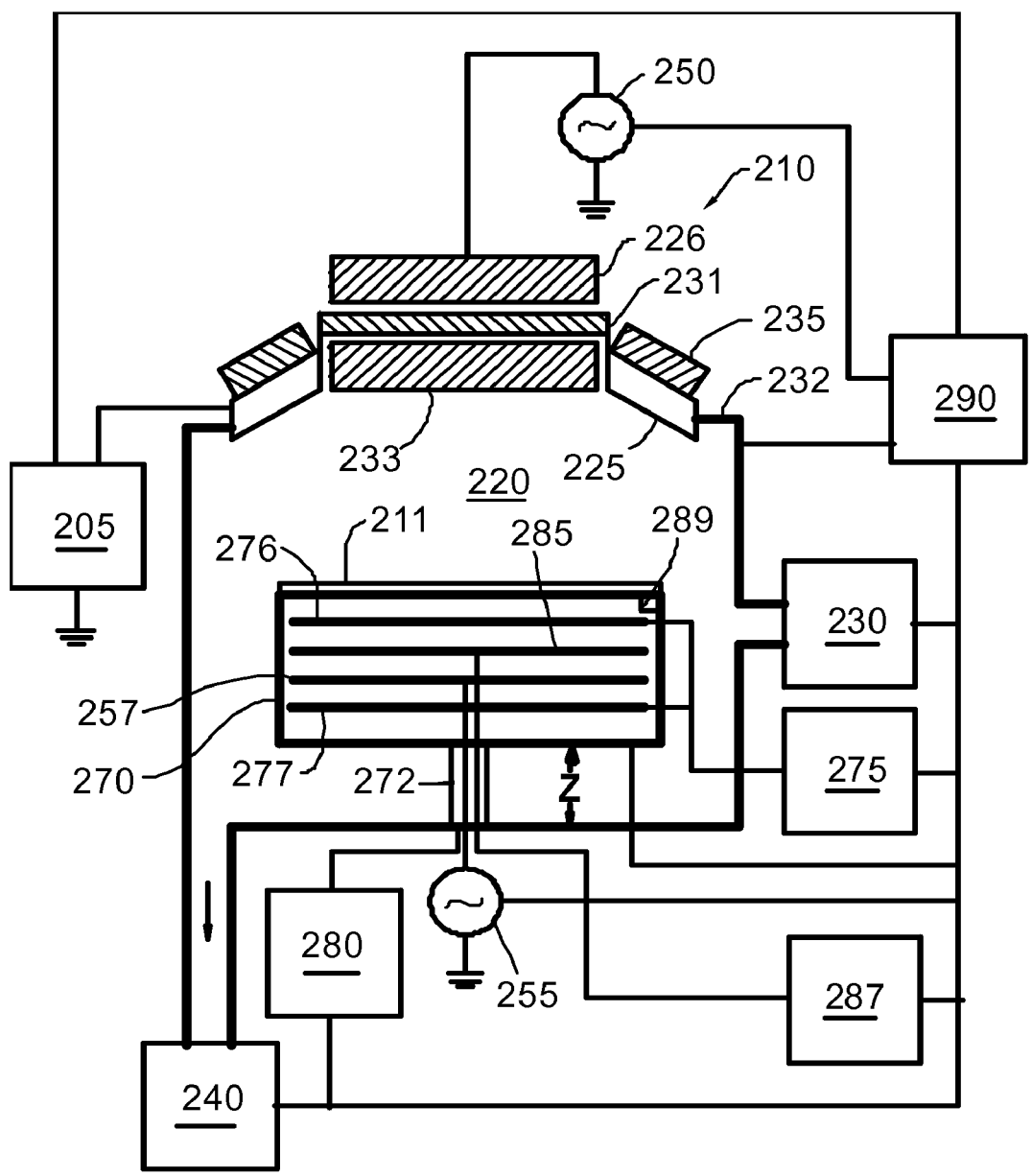
FIG. 2B illustrates an exemplary block diagram of a processing system according to an alternate embodiment of the invention.

FIG. 2B illustrates an exemplary block diagram of a processing system according to an alternate embodiment of the invention. In the illustrated embodiment, an IPVD system 200B is shown that can include the IPVD system shown in FIG. 2A along with a magnet assembly 235 coupled to the processing chamber 200. The magnet assembly 235 may be used to shape the plasma within the processing chamber 200. Examples of apparatus having reduced and controllable magnetic fields are described in U.S. Pat. App. 20040188239, and this patent application is incorporated herein by reference.

As shown in FIG. 2B, a magnet assembly 235 can be located behind the target 225 and can be used to produce and/or change a static magnetic field shape in a process volume within the chamber 200. In one embodiment, a barrier deposition process can be performed using a magnet assembly 235 having a weak magnetic field strength. Field lines from the magnets can extend into the process volume. In alternate embodiments, these or other field lines present in the chamber may be caused to change to enhance the barrier deposition process. For example, magnetic fields may be changed by controlling the magnet configuration, by physically moving and/or rotating a magnet. In addition, an electromagnet or electromagnet component may be used to change a magnetic field. In addition, a local static magnetic field may be used to optimize the performance of the target.

Some magnet pack configurations for IPVD may typically produce static magnetic field strength at the target surface of over 150 Gauss or several hundred Gauss, to provide confinement of the plasma and a desired erosion profile and high target utilization. Reducing the static magnetic field strength at target surface to about 5-10 Gauss eliminates this confinement effect.

In various embodiments, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate holder temperature, substrate temperature, etching rate, and/or deposition rate.

The controller 290 can be used to determine the amount of heat energy that the heater assembly 276 provides and when to have it provided to the substrate 211. The amount of heat energy can be changed between different levels during a barrier deposition process. In addition, the cooling assembly 277 can be used to control the temperature of the temperature-controlled substrate holder 270 and the substrate 211. For example, the thermal mass of the temperature-controlled substrate holder 270 can be controlled to optimize its thermal response time. Furthermore, the thermal conductance between the temperature-controlled substrate holder 270 and the substrate 211 can be controlled by providing backside gas between the substrate 211 and the temperature-controlled substrate holder 270. The controller 290 can monitor and control the substrate temperature, the temperature of the temperature-controlled substrate holder 270, the temperature control system 275, the backside gas supply system 280, and other process parameters during a barrier deposition process to ensure that the metal deposition within the features is substantially uniform. In addition, the performance of the electrostatic chuck 285 may be controlled to compensate for changes in the backside pressure.

Figure 3:
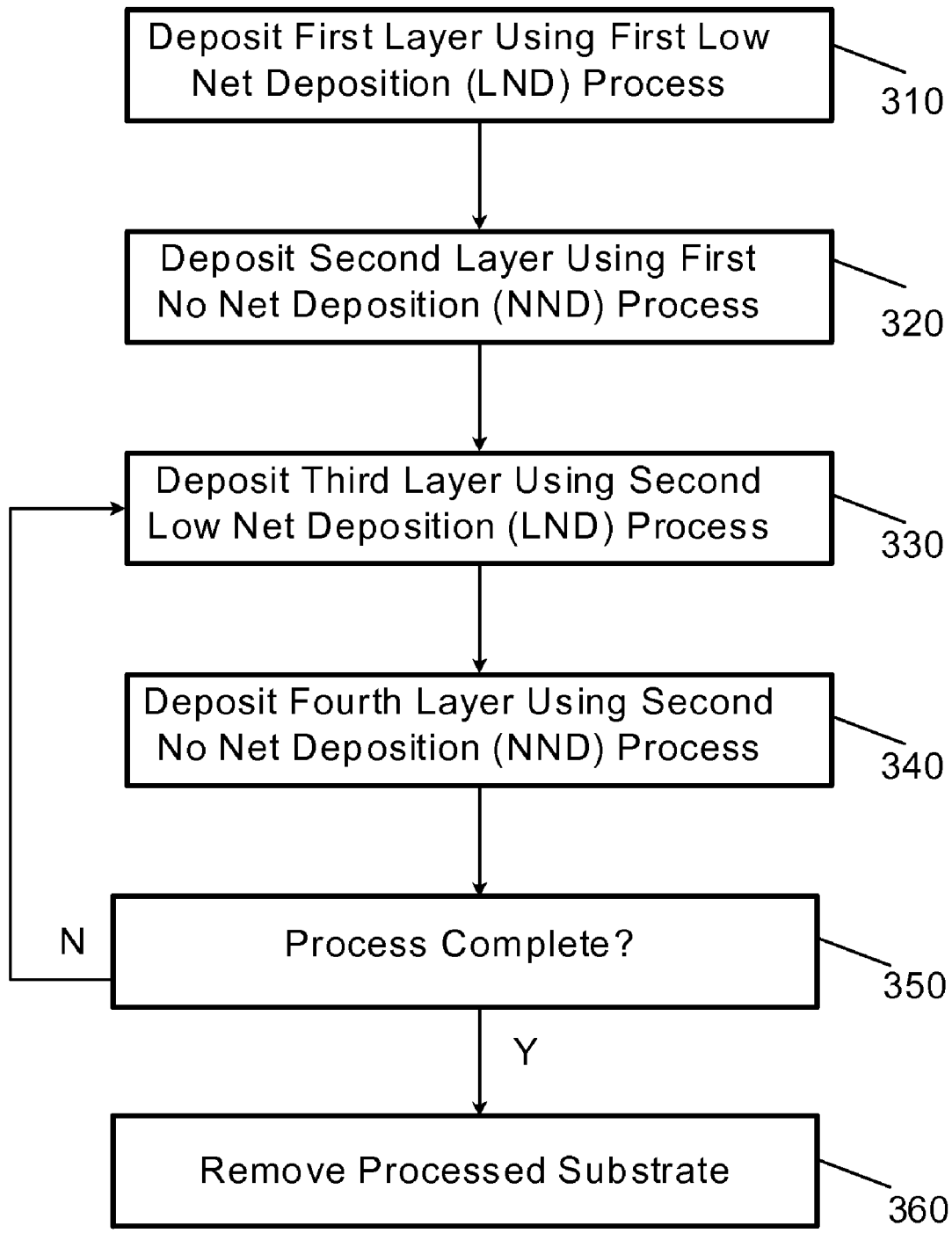
FIG. 3 illustrates a simplified flow diagram of a method of operating a deposition system to perform a barrier deposition process in accordance with an embodiment of the invention.

FIG. 3 illustrates a simplified flow diagram of a method of operating a deposition system to perform a process in accordance with embodiments of the invention. In the illustrated embodiment, a procedure 300 is shown for establishing an improved TaN barrier using multiple layers that can be deposited using two LND procedures and two NND procedures. In alternate embodiments, other procedures can be performed that may include additional NND procedures, additional LND procedures, and additional combinations of LND processes and NND processes.

In 310, a first layer can be deposited on a patterned substrate/wafer using a first Low Net Deposition (LND) procedure and the patterned substrate/wafer can be positioned on a temperature-controlled substrate table in a processing chamber as described herein. Alternately, a non-patterned substrate/wafer may be used. For example, the processing chamber can be an iPVD chamber. In one embodiment, the substrate holder can be vertically translated to establish a first gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

In some LND procedures, a first set of process parameters can be established during a pre-process time in which one or more first process gasses are flowed into the processing chamber, and one or more RF and/or DC sources are set to first levels. In some LND procedures, a first target power and a first RF bias power can be provided at substantially the same time. Alternatively, delay times may be used.

The chamber pressure can be lowered to value between approximately 50 mTorr and approximately 150 mTorr. For example, barrier deposition processes have been performed at 65 mTorr and 90 mTorr.

During the first LND procedure, ICP power can be provided to an antenna coupled to the processing chamber by an ICP source. In an alternate embodiment, a different configuration may be used to create a plasma, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 W to approximately 10000 W. For example, the ICP power can range from approximately 5000 w to approximately 5500 W during the first LND procedure.

In some examples, the processing system can also comprise a Tantalum (Ta) target, and the Ta target can be used to provide a source of metal ions. A DC power source can be coupled to the Tantalum target, and during the first LND procedure, the DC power can be greater than approximately 1500 watts and less than approximately 1900 watts. The processing system can include an RF bias generator 255 that can be coupled to an electrode 257 in the temperature-controlled substrate holder 270, and the RF substrate (table) bias can range from approximately 150 watts to approximately 250 watts during the first LND procedure.

The substrate can be positioned on the temperature-controlled substrate holder 270 during processing. The temperature of the temperature-controlled substrate holder 270 can vary from approximately −50° C. to approximately 70° C. during the first LND procedure. In addition, the processing system can include a backside gas supply system 280 that can be coupled to the temperature-controlled substrate holder 270, and the backside gas pressure can vary from approximately zero Torr to approximately 25 Torr during the first LND procedure. The heater assembly 276 and the cooling assembly 277 can be used along with one or more backside gases to establish the correct substrate temperature. For example, the substrate temperature can vary from approximately −30° C. to approximately 250° C.

The processing system can also comprise a process gas supply system 230 that can be coupled to processing chamber 220, and the gas supply system can be used to flow process gas into the processing chamber during one or more parts of the first LND procedure. The process gas can comprise an inert gas, or a nitrogen-containing gas, or a combination thereof. The nitrogen-containing gas can comprise $N_2$, NO, $N_2O$, and $NH_3$, and the flow rate for a nitrogen-containing gas can vary from approximately zero sccm to approximately 100 sccm. The inert gas can comprise argon, helium, krypton, xenon, or a combination thereof, and the flow rate for an inert gas can vary from approximately zero sccm to approximately 1000 sccm. In some embodiments, the processing gas can be pulsed.

When $N_2$ gas is used during the first LND procedure, the flow rates for the $N_2$ gas can range from 10 sccm to 30 sccm. In addition, when Ar gas is used during the first LND procedure, the flow rates for the Ar gas can range from 200 sccm to 300 sccm.

For example, the first LND procedure can be performed using the following parameters: a DC power equal to approximately 1700 watts, an ICP power equal to approximately 5250 watts, a RF substrate (table) bias equal to approximately 200 watts, a gap equal to approximately 252 mm, a process time equal to approximately 15 seconds, a field deposition rate that is less than or equal to approximately 10 nm/minute, a substrate holder temperature of approximately −50° C., a chamber pressure equal to approximately 65 mTorr, a nitrogen ($N_2$) flow rate equal to approximately 15 sccm and an Argon flow rate equal to approximately 498 sccm. In addition, a number of cycles can be performed. For example, two 14.9-second cycles may be used. When multiple cycles are performed, the process parameters can remain constant, or alternately one or process parameters can change during different cycles. The first layer thickness can be less than approximately five nanometers;

In 320, a second layer can be deposited on the first layer on a patterned substrate/wafer using a first No Net Deposition (NND) procedure and the patterned substrate/wafer can be positioned on a temperature-controlled substrate table in a processing chamber as described herein. Alternately, a non-patterned substrate/wafer may be used. For example, the processing chamber can be an iPVD chamber. In one embodiment, the substrate holder can be vertically translated to establish a gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

In some NND procedures, a first set of process parameters can be established during a pre-process time in which one or more first process gasses are flowed into the processing chamber, and one or more RF and/or DC sources are set to first levels. In some NND procedures, a first target power and a first RF bias power can be provided at substantially the same time. Alternatively, delay times may be used.

The chamber pressure can be lowered to value between approximately 5 mTorr and approximately 15 mTorr.

During the first NND procedure, ICP power can be provided to an antenna coupled to the processing chamber by an ICP source. In an alternate embodiment, a different configuration may be used to create a plasma, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 W to approximately 6000 W. For example, the ICP power can range from approximately 4300 W to approximately 4700 W during the first NND procedure.

In some examples, the processing system can also comprise a Ta target, and the Ta target can be used to provide a source of metal ions. A DC power source can be coupled to the Ta target, and during the first NND procedure, the DC power can be greater than approximately 1800 watts and less than approximately 2200 watts. The processing system can include an RF bias generator 255 that can be coupled to an electrode 257 in the temperature-controlled substrate holder 270, and the RF substrate (table) bias can range from approximately 500 watts to approximately 900 watts during the first NND procedure.

The substrate can be positioned on the temperature-controlled substrate holder 270 during processing. The temperature of the temperature-controlled substrate holder 270 can vary from approximately −50° C. to approximately 70° C. during the first NND procedure. In addition, the processing system can include a backside gas supply system 280 that can be coupled to the temperature-controlled substrate holder 270, and the backside gas pressure can vary from approximately zero Torr to approximately 25 Torr during the first NND procedure. The heater assembly 276 and the cooling assembly 277 can be used along with one or more backside gases to establish the correct substrate temperature. For example, the substrate temperature can vary from approximately −30° C. to approximately 250° C.

The processing system can also comprise a process gas supply system 230 that can be coupled to processing chamber 220, and the gas supply system can be used to flow process gas into the processing chamber during one or more parts of the first NND procedure. The process gas can comprise an inert gas, or a nitrogen-containing gas, or a combination thereof. The nitrogen-containing gas can comprise $N_2$, NO, $N_2O$, and $NH_3$, and the flow rate for a nitrogen-containing gas can vary from approximately zero sccm to approximately 100 sccm. The inert gas can comprise argon, helium, krypton, xenon, or a combination thereof, and the flow rate for an inert gas can vary from approximately zero sccm to approximately 1000 sccm. In some embodiments, the processing gas can be pulsed.

When $N_2$ gas is used during the first NND procedure, the flow rates for the $N_2$ gas can range from 10 sccm to 30 sccm. In addition, when Ar gas is used during the first NND procedure, the flow rates for the Ar gas can range from 200 sccm to 300 sccm.

For example, the first NND procedure can be performed using the following parameters: a DC power equal to approximately 2000 watts, an ICP power equal to approximately 4500 watts, a RF substrate (table) bias equal to approximately 720 watts, a gap equal to approximately 252 mm, a process cycle time equal to approximately 15 seconds, a substrate holder temperature of approximately −50° C., a chamber pressure equal to approximately 10 mTorr, a nitrogen ($N_2$) flow rate equal to approximately 15 sccm and an Argon flow rate equal to approximately 498 sccm. In addition, a number of cycles can be performed. For example, two 1.9-second cycles may be used. When multiple cycles are performed, the process parameters can remain constant, or alternately one or process parameters can change during different cycles. The second layer thickness can vary from approximately 0.25 nm to approximately 3 nm.

In 330, a third layer can be deposited on the second layer on the patterned substrate/wafer using a second Low Net Deposition (LND) procedure and the patterned substrate/wafer can be positioned on a temperature-controlled substrate table in a processing chamber as described herein. Alternately, a non-patterned substrate/wafer may be used. For example, the processing chamber can be an iPVD chamber. In one embodiment, the substrate holder can be vertically translated to establish a gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

The chamber pressure can be lowered to value between approximately 50 mTorr and approximately 150 mTorr. For example, barrier deposition processes have been performed at 65 mTorr and 90 mTorr.

During the second LND procedure, ICP power can be provided to an antenna coupled to the processing chamber by an ICP source. In an alternate embodiment, a different configuration may be used to create a plasma, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 W to approximately 10000 W. For example, the ICP power can range from approximately 5000 W to approximately 5500 W during the second LND procedure.

In some examples, the processing system can also comprise a Ta target, and the Ta target can be used to provide a source of metal ions during the second LND procedure. A DC power source can be coupled to the Ta target, and during the second LND procedure, the DC power can be greater than approximately 1500 watts and less than approximately 1900 watts. The processing system can include an RF bias generator 255 that can be coupled to an electrode 257 in the temperature-controlled substrate holder 270, and the RF substrate (table) bias can range from approximately 150 watts to approximately 250 watts during the second LND procedure.

The substrate can be positioned on the temperature-controlled substrate holder 270 during processing. The temperature of the temperature-controlled substrate holder 270 can vary from approximately −50° C. to approximately 70° C. during the second LND procedure. In addition, the processing system can include a backside gas supply system 280 that can be coupled to the temperature-controlled substrate holder 270, and the backside gas pressure can vary from approximately zero Torr to approximately 25 Torr during the second LND procedure. The heater assembly 276 and the cooling assembly 277 can be used along with one or more backside gases to establish the correct substrate temperature. For example, the substrate temperature can vary from approximately −30° C. to approximately 250° C.

The processing system can also comprise a process gas supply system 230 that can be coupled to processing chamber 220, and the gas supply system can be used to flow process gas into the processing chamber during one or more parts of the second LND procedure. The process gas can comprise an inert gas, or a nitrogen-containing gas, or a combination thereof. The nitrogen-containing gas can comprise $N_2$, NO, $N_2O$, and $NH_3$, and the flow rate for a nitrogen-containing gas can vary from approximately zero sccm to approximately 100 sccm. The inert gas can comprise argon, helium, krypton, xenon, or a combination thereof, and the flow rate for an inert gas can vary from approximately zero sccm to approximately 1000 sccm. In some embodiments, the processing gas can be pulsed.

When $N_2$ gas is used during the second LND procedure, the flow rates for the $N_2$ gas can range from 10 sccm to 30 sccm. In addition, when Ar gas is used during the second LND procedure, the flow rates for the Ar gas can range from 200 sccm to 300 sccm.

For example, the second LND procedure can be performed using the following parameters: a DC power equal to approximately 1700 watts, an ICP power equal to approximately 5250 watts, a RF substrate (table) bias equal to approximately 200 watts, a gap equal to approximately 252 mm, a process cycle time equal to approximately 15 seconds, a field deposition rate that is less than or equal to approximately 10 nm/minute, a substrate holder temperature of approximately −50° C., a chamber pressure equal to approximately 65 mTorr, a nitrogen ($N_2$) flow rate equal to approximately 15 sccm and an Argon flow rate equal to approximately 498 sccm. In addition, a number of cycles can be performed. For example, two 14.9-second cycles may be used. When multiple cycles are performed, the process parameters can remain constant, or alternately one or process parameters can change during different cycles. The third layer thickness can vary from approximately 2 nm to approximately 5 nm.

In 340, a fourth layer can be deposited on the third layer on a patterned substrate/wafer using a second No Net Deposition (NND) procedure and the patterned substrate/wafer can be positioned on a temperature-controlled substrate table in a processing chamber as described herein. Alternately, a non-patterned substrate/wafer may be used. For example, the processing chamber can be an iPVD chamber. In one embodiment, the substrate holder can be vertically translated to establish a gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

The chamber pressure can be lowered to value between approximately 5 mTorr and approximately 15 mTorr.

During the second NND procedure, ICP power can be provided to an antenna coupled to the processing chamber by an ICP source. In an alternate embodiment, a different configuration may be used to create a plasma, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 W to approximately 6000 W. For example, the ICP power can range from approximately 4300 W to approximately 4700 W during the second NND procedure.

In some examples, the processing system can also comprise a Ta target, and the Ta target can be used to provide a source of metal ions during the second NND procedure. A DC power source can be coupled to the Ta target, and during the second NND procedure, the DC power can be greater than approximately 1800 watts and less than approximately 2200 watts. The processing system can include an RF bias generator 255 that can be coupled to an electrode 257 in the temperature-controlled substrate holder 270, and the RF substrate (table) bias can range from approximately 500 watts to approximately 900 watts during the second NND procedure.

The substrate can be positioned on the temperature-controlled substrate holder 270 during processing. The temperature of the temperature-controlled substrate holder 270 can vary from approximately −50° C. to approximately 70° C. during the second NND procedure. In addition, the processing system can include a backside gas supply system 280 that can be coupled to the temperature-controlled substrate holder 270, and the backside gas pressure can vary from approximately zero Torr to approximately 25 Torr during the second NND procedure. The heater assembly 276 and the cooling assembly 277 can be used along with one or more backside gases to establish the correct substrate temperature. For example, the substrate temperature can vary from approximately −30° C. to approximately 250° C.

The processing system can also comprise a process gas supply system 230 that can be coupled to processing chamber 220, and the gas supply system can be used to flow process gas into the processing chamber during one or more parts of the second NND procedure. The process gas can comprise an inert gas, or a nitrogen-containing gas, or a combination thereof. The nitrogen-containing gas can comprise $N_2$, NO, $N_2O$, and $NH_3$, and the flow rate for a nitrogen-containing gas can vary from approximately 0 sccm to approximately 100 sccm. The inert gas can comprise argon, helium, krypton, xenon, or a combination thereof, and the flow rate for an inert gas can vary from approximately 0 sccm to approximately 1000 sccm. In some embodiments, the processing gas can be pulsed.

When $N_2$ gas is used during the second NND procedure, the flow rates for the $N_2$ gas can range from 10 sccm to 30 sccm. In addition, when Ar gas is used during the second NND procedure, the flow rates for the Ar gas can range from 200 sccm to 300 sccm.

For example, the first NND procedure can be performed using the following parameters: a DC power equal to approximately 2000 watts, an ICP power equal to approximately 4500 watts, a RF substrate (table) bias equal to approximately 720 watts, a gap equal to approximately 252 mm, a process cycle time equal to approximately 15 seconds, a substrate holder temperature of approximately −50° C., a chamber pressure equal to approximately 10 mTorr, a nitrogen ($N_2$) flow rate equal to approximately 15 sccm and an Argon flow rate equal to approximately 498 sccm. In addition, a number of cycles can be performed. For example, two 1.9-second cycles may be used. When multiple cycles are performed, the process parameters can remain constant, or alternately one or process parameters can change during different cycles. The fourth layer thickness can vary from approximately 0.25 nm to approximately 3 nm.

Using the apparatus and method of the present invention, a TaN barrier can be deposited with high N concentration (high N/Ta ratio). For example, annealing experiments/tests were performed to verify the improved performance. The process is stable, and the target purity can still be maintained with a higher N concentration in the film. An ultra-thin barrier can be deposited and the ultra-thin barrier can still act as barrier to Cu diffusion as well as "etch stop" layer for subsequent deposition/etch processes, such as Ta (for wetting) layer or Cu for seed layer.

Furthermore, the present invention provides a stable metal mode with a high N/Ta ratio, and does not allow the Ta target to become poisoned (nitrated).

In addition, certain embodiments can be configured to have either a reduced strength static magnetic field in vicinity of the target surface or with no static magnetic field. A weak magnet configuration may be used to maintain the static magnetic field shape and orientation so that the field within the target area and the nearby plasma generates an optimal erosion profile for high target utilization. Such low or reduced field strength can be maintained constant in the barrier deposition processes, or may be changed to a different level during the barrier deposition process. For example, a controllable magnetic field may be used to provide a weak or zero static magnetic field, for example less than 10 Gauss, in the process volume. Furthermore, a controllable magnetic field may be used to reduce and/or reshape the magnetic field to adjust the field uniformity across the target surface.

In some embodiments, simultaneous control of the target power and the RF substrate bias power can be used to provide a Low Net Deposition (LND) in the field area of the substrate. Furthermore, during the LND processing time, a chamber pressure, a chamber temperature, a substrate temperature, a process gas chemistry, a process gas flow rate, a gap size, an ICP power, substrate position, a target power, and a RF substrate bias power can be adjusted to establish and/or maintain the required LND deposition rate. As the LND process is performed material can be deposited into features of the patterned substrate while producing substantially no overhanging material at openings of the features and a low net deposition in the field area of the substrate.

The TaN barrier deposition rate can comprise a field deposition rate that can range from approximately −10 nm/min to approximately +10 nm/min. For example, the field deposition rate can range from approximately +6 nm/min to approximately +10 nm/min. The TaN barrier deposition rate can comprise a sidewall deposition rate that is the rate of deposition of material on one or more sidewalls of one or more features of the patterned substrate. The sidewall deposition rate can range from approximately −1 nm/min to approximately +10 nm/min. For example, sidewall deposition rate can vary from approximately 20% to approximately 100% of the field deposition rate. The TaN barrier process can comprise a bottom surface deposition rate that is the rate of deposition of material on one or more bottom surfaces of one or more features of the patterned substrate. During various portions of the TaN barrier process, the bottom surface deposition rate can range from approximately −10 nm/min to approximately +10 nm/min. For example, the bottom surface deposition rate can range from approximately −5 nm/min to approximately +5 nm/min.

In the TaN barrier process, a deposition time period may be used to add material on the field area on the top surface of the substrate and a shaping (DC-off) time may be used to remove an amount of material on the field area on the top surface of the substrate, and thus there is a low net deposition at the end of the process cycle on the field area on the top surface of the substrate. In addition, during the NND process, the deposition component may add material on the bottom and/or side surfaces of features on the substrate and the etching (sputtering) component may remove a lesser amount of material on the bottom and/or side surfaces of features on the substrate, and thus there is a net deposition at the end of the process cycle on the bottom and/or side surfaces of features on the substrate. The deposition/etch cycle can be repeated as many times as needed to achieve the desired result. By adjusting the DC level and the RF substrate bias levels, the overhang growth is eliminated or minimized. The overhang may be etched back and redistributed at least partially to the sidewalls. For example, the sputtering component can remove some of the excess material from the via bottom and from the overhangs. When the metal layer is copper, the etch process increases the continuity of the Cu on the bottom and top portions of the feature sidewalls by redeposition of Cu sputtered from the via bottom and from the overhang at the via entrance. If the metal being etched is a barrier layer, the decrease in the thickness at the via bottom reduces the overall contact resistance of the via and improves device performance. To deposit a barrier layer of a metal nitride such as $TaN_x$, nitrogen gas, in addition to Argon gas, is used during sputter deposition.

In 350, a query is performed to determine when the process has been completed. When the process has been completed, procedure 300 continues to 360, and when the process has not been completed, procedure 300 branches back to 330, and procedure 300 continues as shown in FIG. 3. For example, one or more of the LND deposition processes may be performed one or more times.

For example, after a certain desired amount of deposition, the DC power to the target and the RF substrate bias can be simultaneously turned off to substantially stop the deposition process. Those skilled in this art will realize that the deposition process can be substantially reduced and/or stopped by reducing the DC power level to a very low level without completely turning it off. When multiple cycles are performed the process parameters can remain constant, or alternatively one or process parameters can change during different cycles.

In 360, the processed substrate can be removed from the processing chamber, and procedure 300 can end in 360.

For example during process development, a TaN(LND1) process was performed using the following parameters: a DC power equal to approximately 2200 watts, an ICP power equal to approximately 5250 watts, a RF substrate (table) bias equal to approximately 200 watts, a gap equal to approximately 220 mm, a process time equal to approximately 24 seconds, a deposition rate equal to approximately 16 nm/minute, a chamber pressure equal to approximately 65 mTorr, an Argon flow rate equal to approximately 480 sccm, and a Nitrogen flow rate equal to approximately 24 sccm. In addition, a number of deposition cycles can be performed, and the TaN(LND1) process can be repeated a number of times (1-10) without adverse affects.

In another example during process development, a TaN (LND1) process was performed using the following parameters: a DC power equal to approximately 1500 watts, an ICP power equal to approximately 5250 watts, a RF substrate (table) bias equal to approximately 200 watts, a gap equal to approximately 220 mm, a process time equal to approximately 5.3 seconds, a deposition rate equal to approximately 30 nm/minute, a chamber pressure equal to approximately 5 mTorr, an Argon flow rate equal to approximately 105 sccm, and a Nitrogen flow rate equal to approximately 23 sccm.

In a different example during process development, a TaN (LND2) process was performed using the following parameters: a DC power equal to approximately 1500 watts, an ICP power equal to approximately 5250 watts, a RF substrate (table) bias equal to approximately 400 watts, a gap equal to approximately 220 mm, a process time equal to approximately 5.4 seconds, a deposition rate equal to approximately 30 nm/minute, a chamber pressure equal to approximately 5 mTorr, an Argon flow rate equal to approximately 105 sccm and a Nitrogen flow rate equal to approximately 23 sccm.

In some cases, the substrate can be removed from the processing chamber and measured in another chamber. For example, an optical metrology tool can be used. In addition, Scanning Electron Microscope (SEM) data and/or Transmission Electron Microscope (TEM) data can be used.

Measurement data can be obtained during a process and used to determine when to stop the process. Measurement data can include chamber pressure data, chamber temperature data, substrate temperature data, process gas chemistry data, process gas flow rate data, target material data, ICP power data, substrate position data, target power data, RF substrate bias power data, processing time data, process recipe data, or a combination thereof.

A processing time may be used to determine when to stop a process. Alternately, thickness data can be used to determine when to stop a process.

The additional process can comprise an LND process, an NND process, a conventional deposition process, an etching process, a deposition/etch process, a cleaning process, a measurement process, a storing process, an electroplating process, or a combination thereof. The additional processes can be performed in the same processing chamber or other processing chambers. For example, one or more processing chambers can be coupled to each other by a transfer system.

Timing can be controlled so that the target power is provided and/or changed at the correct setpoints in the process recipe. For example, the target power can be controlled to eliminate or control/minimize an etching component.

The apparatus and methods of the invention can be used to produce an ultra-thin substantially amorphous barrier having excellent etch resistance properties, excellent Copper diffusion properties, without damaging the underlying layers or poisoning the target. The apparatus and methods of the invention provide a wide stable process window in which a LND process is performed using a "non-poison" metal mode.

Figure 4:
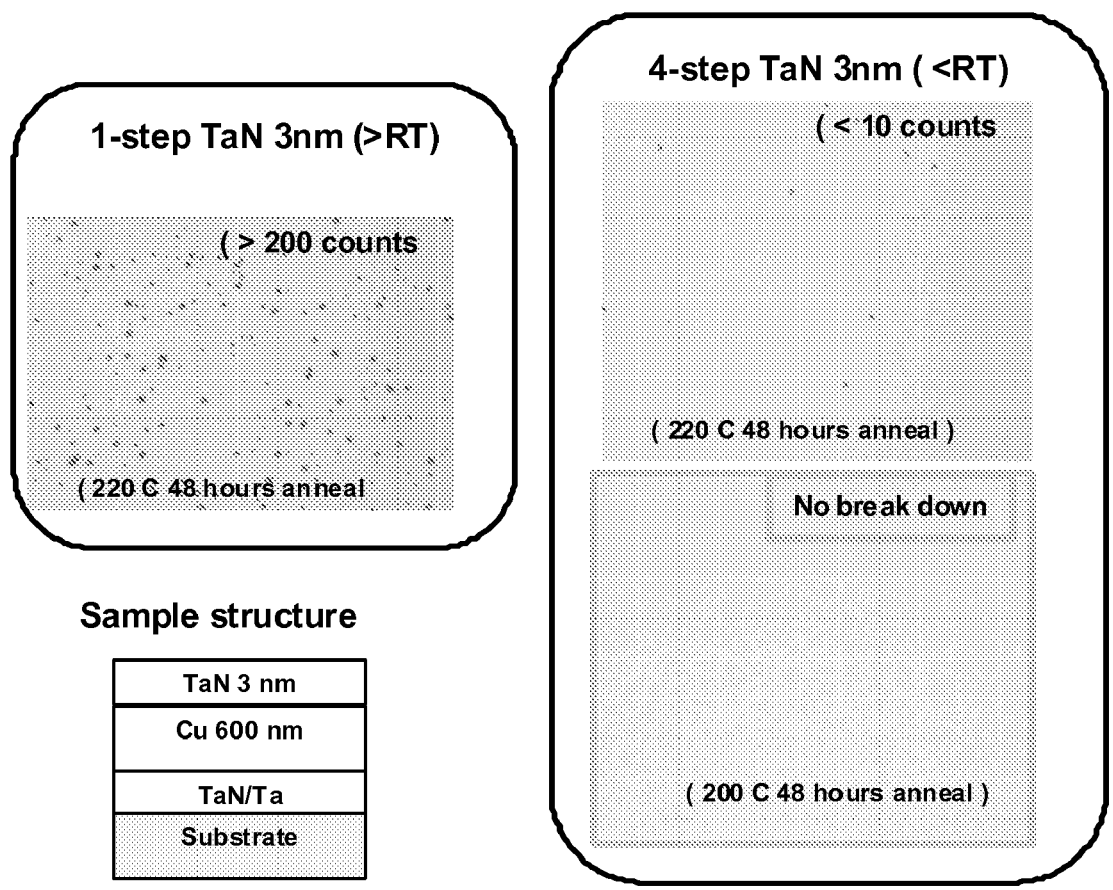
FIG. 4 illustrates exemplary process results in accordance with embodiments of the invention.

FIG. 4 illustrates exemplary process results in accordance with embodiments of the invention. An exemplary structure is shown, and oxidation test results are shown for a one-step process performed with the substrate temperature above room temperature and a four-step process performed with the substrate temperature below room temperature. The temperatures for the cooling assembly 277 "chiller" coupled to the temperature-controlled substrate holder 270 can be lower than the substrate temperature.

Figure 5:
FIG. 5 illustrates additional exemplary process results in accordance with embodiments of the invention.
Figure 5:
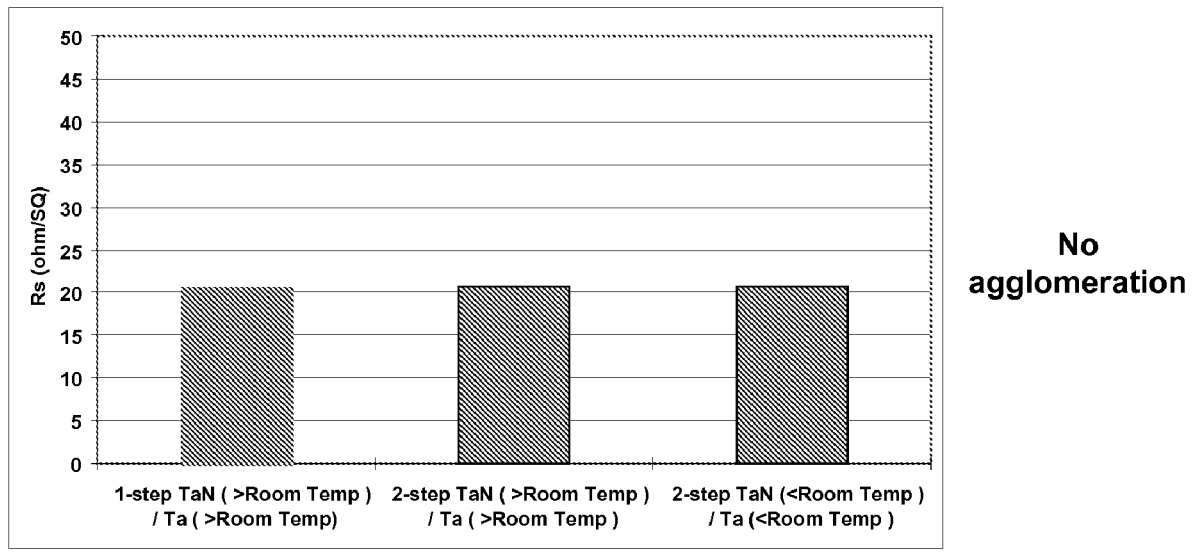

FIG. 5 illustrates additional exemplary process results in accordance with embodiments of the invention. Another exemplary structure is shown, and wettability test results are shown for a one-step process performed with the substrate temperature above room temperature, a two-step process performed with the substrate temperature above room temperature and a two-step process performed with the substrate temperature below room temperature. This exemplary data seems to indicate that the TaN condition does not affect the Ta—Cu wettability. The temperatures for the cooling assembly 277 "chiller" coupled to the temperature-controlled substrate holder 270 can be lower than the substrate temperature.

Figure 6:
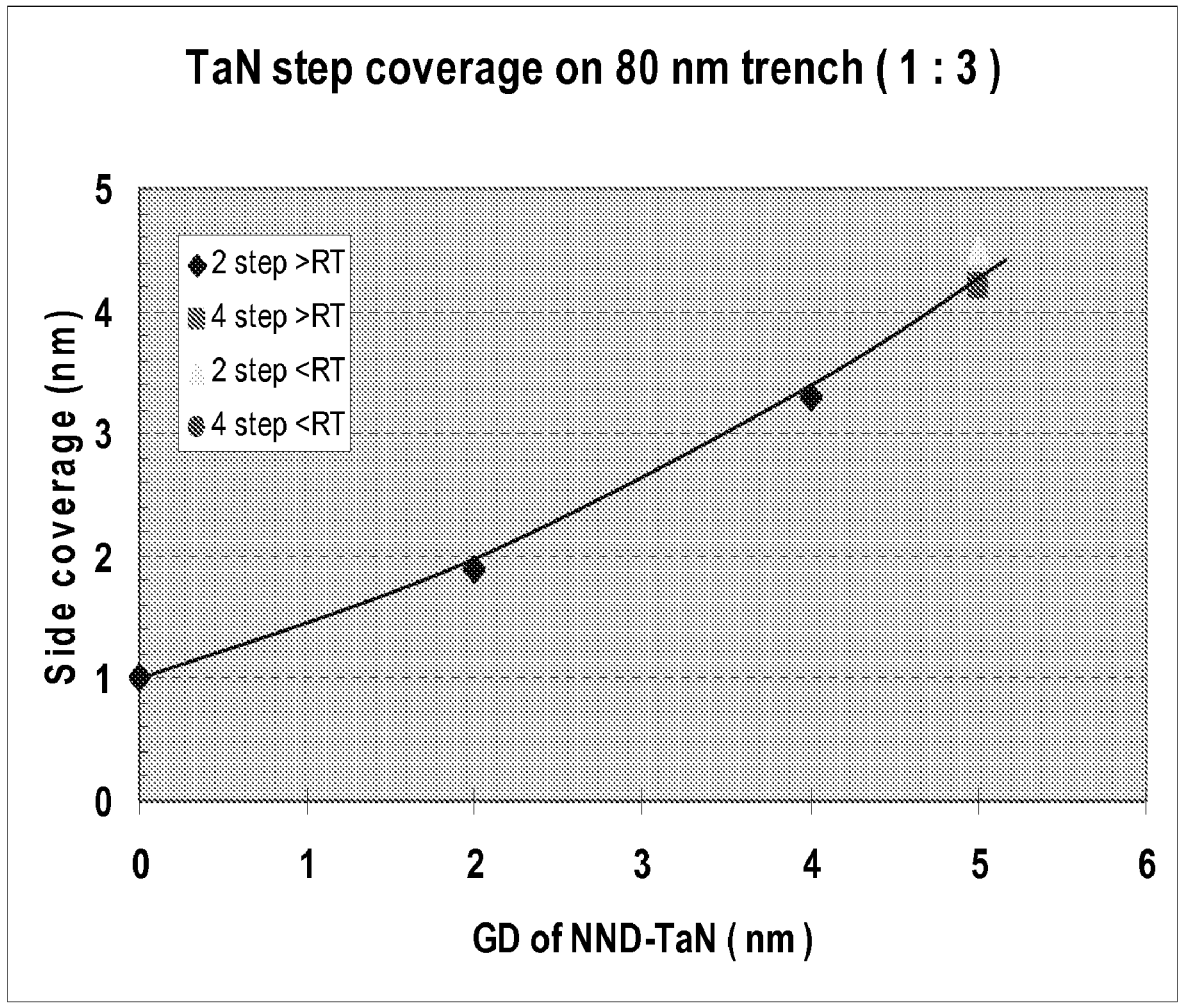
FIG. 6 illustrates an exemplary graph of process results in accordance with embodiments of the invention.

FIG. 6 illustrates an exemplary graph of process results in accordance with embodiments of the invention. The illustrated graph shows sidewall coverage (nm) versus gross deposition (GD) of the NND-TaN (nm) for a two-step process performed with the substrate temperature above room temperature, a four-step process performed with the substrate temperature above room temperature, a two-step process performed with the substrate temperature below room temperature, and a four-step process performed with the substrate temperature below room temperature. This exemplary data seems to indicate that the sidewall coverage of the four-step procedure is substantially the same or better than the sidewall coverage of the two-step procedure. In addition, the exemplary data shows that the step coverage is dependent on total gross deposition amount of NND-TaN. The temperatures for the cooling assembly 277 "chiller" coupled to the temperature-controlled substrate holder 270 can be lower than the substrate temperature.

Figure 7:
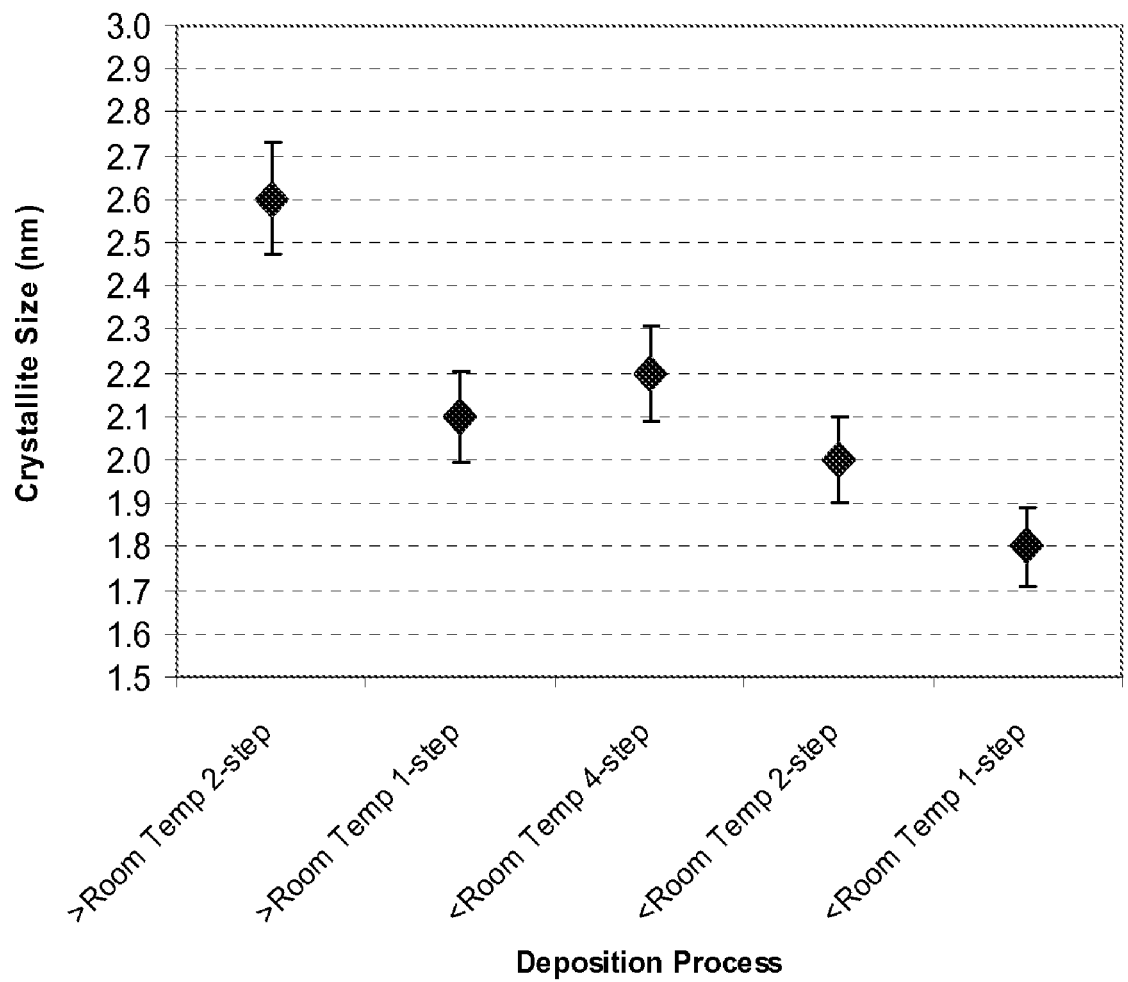
FIG. 7 illustrates a second exemplary graph of process results in accordance with embodiments of the invention.

FIG. 7 illustrates a second exemplary graph of process results in accordance with embodiments of the invention. The second exemplary graph shows crystallite size (nm) versus deposition procedures. Five deposition procedures are shown including a two-step procedures at greater than room temperature, an LND procedure at greater than room temperature, a four-step procedure at less than room temperature, a two-step procedure at less than room temperature, and a LND procedure at less than room temperature. The deposition procedures are shown for films having thicknesses ranging from approximately 6 nm to approximately 8 nm. This exemplary data seems to indicate that the exemplary films are substantially amorphous films, and the substrate holder temperature does not seem to reduce the size of the crystallites. The NND procedure seems to increase the grain size while improving the oxidation resistance. The four-step procedure produces a substantially better barrier than the two-step procedure, but the mechanism does not appear to be dependent on the grain size. In addition, the inventors believe that the oxidation resistance mechanism may also be dependent upon increased film density and/or an interfacial effect.

Figure 8:
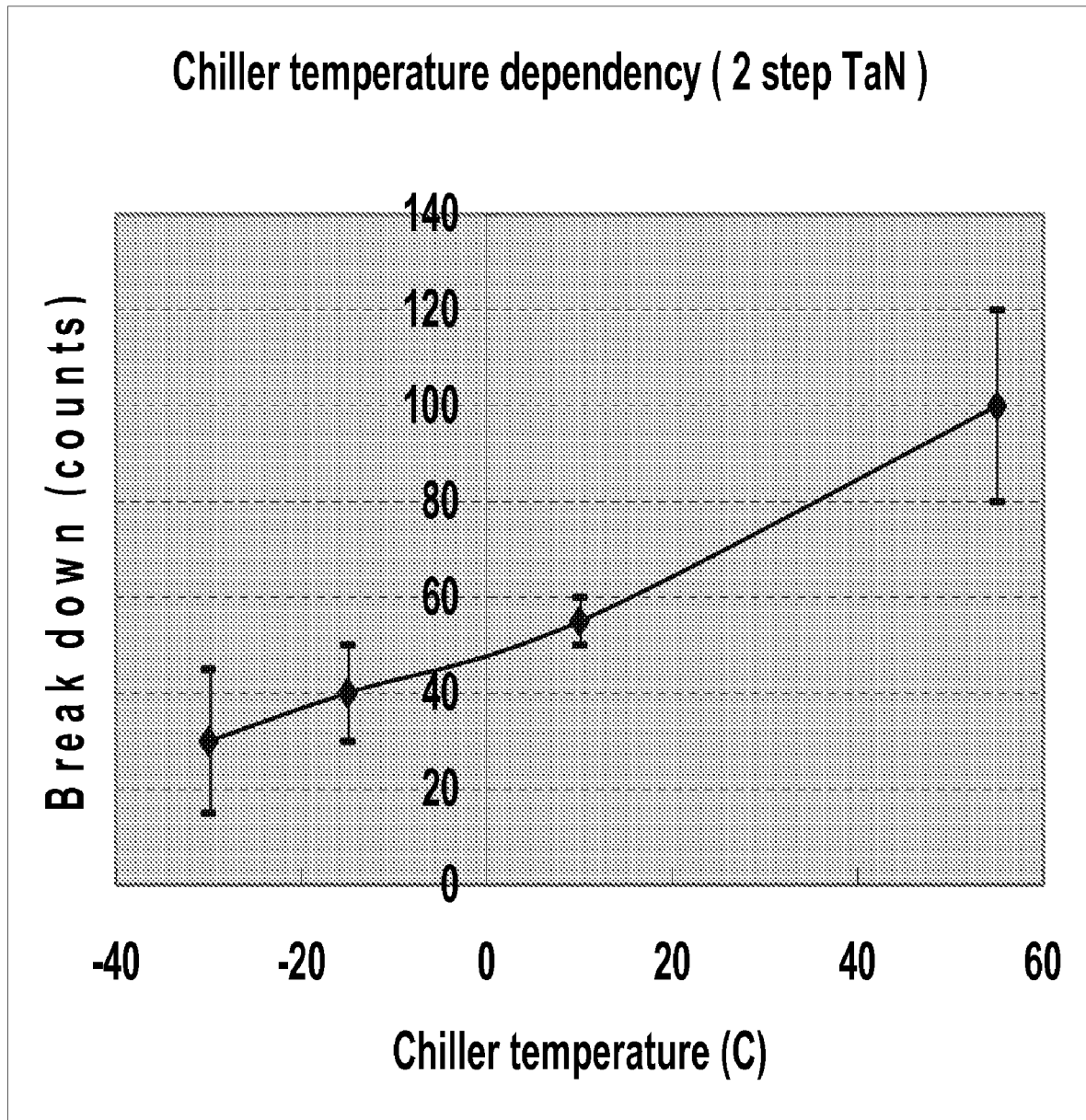
FIG. 8 illustrates a third exemplary graph of process results in accordance with embodiments of the invention.

FIG. 8 illustrates a third exemplary graph of process results in accordance with embodiments of the invention. The third exemplary graph shows breakdown (counts) versus chiller temperature (C). Four two-step procedures are shown including a two-step procedure >Room Temperature, a two-step procedures at just below room temperature, and two 2-step procedures at much below room temperature. The temperatures shown are for the cooling assembly 277 "chiller" coupled to the temperature-controlled substrate holder 270, and the substrate temperature may be higher. The films were approximately 3 nm thick and were annealed at 220° C. for 48 hours. The inventors will be investigating lower temperatures and believe temperatures still lower than those shown in FIG. 8 may provide additional improvements.

In alternate embodiments, other process parameters and/or combinations of process parameters may be used to examine the TaN barrier deposition process space. For example, the processing space can be examined using density data, and Rutherford Back Scattering (RBS) density data and/or x-ray fluorescence (XRF) density data. RBS and/or XRF can be used to measure the stoichiometry of barrier films, where the stoichiometry is measure the ratio of one element to another element in the barrier film. Alternatively, other measurement devices known to those skilled in the art can be used.

The apparatus and methods of the invention provide a wide process window. For example, the processing time window is expected to vary from approximately 10 seconds to approximately 300 seconds, and multiple cycles can be performed to obtain a graded or uniform layer. The chamber pressure can vary from approximately 5 mTorr to approximately 150 mTorr, the ICP power can vary from approximately 2000 watts to approximately 10000 watts; the target power can vary from approximately 100 watts DC to approximately 3000 watts DC; the substrate bias power can vary from approximately 0 watts to approximately 300 watts; the flow rate for an inert gas can vary from approximately 0 sccm to approximately 1000 sccm; the flow rate for a nitrogen-containing gas can vary from approximately 0 sccm to approximately 100 sccm; the gap size between the substrate and the target can vary from approximately 150 mm to approximately 300 mm; the substrate temperature can vary from approximately −30° C. to approximately 250° C.; the field deposition rate can vary from approximately 5 nm/min to approximately 50 nm/min; the bottom coverage (BC) deposition rate can be a percentage of the field deposition rate and the BC percentage can vary from approximately 5% to approximately 50%; the sidewall coverage (SC) deposition rate can be a percentage of the field deposition rate and the SC percentage can vary from approximately 5% to approximately 50%.

The invention provides a method for controlling the film stoichiometry of Ta-containing films on the sidewalls of ultra-small high aspect ratio features. In addition, the apparatus and methods of the invention provide a large process window to vary nitrogen incorporation in one or more TaN(x) layers. The thin film specific resistivity can vary from Ta only (160 mWcm) to an insulator like >18K mWcm while maintaining the target in non-poison or metal mode. An excellent copper (Cu) barrier can be provided with very thin multi-layer films (<5 nm), and an excellent moisture and/or oxidation barrier can be provided with a very thin multilayer films (<5 nm). Furthermore, the deposited multi-layer films have amorphous and/or nano-crystalline film properties. For example, this can be especially useful for ultra low-k (ULK) dielectrics or high moisture containing dielectrics.

The invention provides a method of depositing a plurality of ultra-thin TaN layers having various Nitrogen concentrations to produce a high N/Ta ratio multi-layer barrier to copper (Cu) diffusion, and during the deposition process, the DC target operates in non-poison or metal mode to provide target voltage stability, deposition rate stability, and improved process stability.

The invention provides a method of depositing an ultra-thin TaN barrier layer and during the deposition process the Nitrogen concentration is varied to produce a barrier layer having a range of N/Ta ratios for providing a harder film with improved copper (Cu) diffusion barrier properties and improved etch resistance properties.

In the metallization of high aspect ratio via holes and trenches on semiconductor wafers and/or substrates, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via or feature. A thick barrier layer at the bottom of a via or feature may add substantial undesirable electrical resistance to the resistance of interconnect metallization.

In the LND procedure, metal can be sputtered off the target at a low rate. This results in only a minor dilution of the process gas ion plasma. The metal ionizes and is deposited on the substrate with a rate that can be less than 10 nm/min. A low bias is applied to the substrate to attract the ions to the bottom of the feature. Because of the low field deposition rate and the low bias, the metal deposits with little or no overhang developing. The sidewall coverage is enhanced, and the result is a highly conformal metal deposition, ideal for a barrier metal.

In some embodiments, the sidewall stoichiometry of a metal nitride can be controlled throughout the deposition process by varying nitrogen or reactive gas flow. In addition, the nitridization of a metal film sidewall can be controlled by controlling an $Ar/N_2$ ratio during the deposition process. In addition, the substrate bias can be controlled to eliminate or minimize the etching of the interlayer dielectric or pre-metalized surfaces.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating an Ionized Physical Vapor Deposition (IPVD) system to deposit a barrier layer, comprising:
    positioning a patterned substrate on a temperature-controlled substrate holder within a processing chamber;
    depositing a first TaN layer on the patterned substrate using a first Low Net Deposition (LND) procedure, a first TaN layer thickness being less than approximately five nanometers, wherein the first TaN layer has a (N/Ta) ratio greater than 0.4;
    depositing a second TaN layer on the first TaN layer on the patterned substrate using a first No Net Deposition (NND) procedure, a second TaN layer thickness being less than approximately three nanometer, wherein the second TaN layer has a (N/Ta) ratio less than 0.2;
    depositing a third TaN layer on the second TaN layer on the patterned substrate using a second LND procedure, a third TaN layer thickness being less than approximately five nanometers, wherein the third TaN layer has a (N/Ta) ratio greater than 0.4;
    depositing a fourth TaN layer on the third TaN layer on the patterned substrate using a second NND procedure, a fourth TaN layer thickness being less than approximately three nanometer, wherein the fourth TaN layer has a (N/Ta) ratio less than 0.2; and
    removing the patterned substrate from the processing chamber, the barrier layer having a crystallite size less than 2.4 nm.

2. The method as claimed in claim 1, where the first LND procedure further comprises:
    establishing a first temperature for the temperature-controlled substrate holder, the first temperature being below zero degrees Celsius;
    establishing a first pressure within the processing chamber, wherein the first pressure is between approximately 50 mTorr and approximately 150 mTorr;
    flowing an inert gas into the processing chamber at a first inert gas flow rate, the IPVD system comprising a gas supply system coupled to the processing chamber, wherein the first inert gas flow rate varies between approximately 0 sccm and approximately 1000 sccm;
    creating a first high-density plasma; wherein the IPVD system comprises an inductively coupled plasma (ICP) source coupled to the processing chamber using an antenna, the ICP source operating at a first ICP power ranging from approximately 5000 watts to approximately 5500 watts, and operating at a first ICP frequency between approximately 1 MHz and 100 MHz;
    providing a first target power to a Tantalum (Ta) target positioned within the processing chamber, wherein the IPVD system further comprises a target power source coupled to the Ta target, the first target power being between approximately 1500 watts and approximately 1900 watts;
    providing a first RF substrate bias power to an electrode in the temperature-controlled substrate holder, the first RF substrate bias power being between approximately 150 watts and approximately 250 watts;
    flowing a Nitrogen-containing gas into the processing chamber at a second flow rate, wherein the second flow rate varies between approximately 10 sccm and approximately 30 sccm; and
    exposing the patterned substrate to the first high-density plasma during a first LND processing time.

3. The method as claimed in claim 2, wherein first TaN layer thickness is less than approximately three nanometers.

4. The method as claimed in claim 2, wherein the temperature-controlled substrate holder is vertically translated to establish a first gap between the Ta target and the patterned substrate, and the first gap varies from approximately 150 mm to approximately 300 mm.

5. The method as claimed in claim 2, wherein the first LND processing time comprises at least two cycles having first durations of approximately 14.9 seconds.

6. The method as claimed in claim 1, where the first NND procedure further comprises:
    establishing a second temperature for the temperature-controlled substrate holder, the second temperature being below zero degrees Celsius;
    establishing a second pressure within the processing chamber, wherein the second pressure is between approximately 50 mTorr and approximately 150 mTorr;
    flowing an inert gas into the processing chamber at a second inert gas flow rate, the IPVD system comprising a gas supply system coupled to the processing chamber, wherein the second inert gas flow rate varies between approximately 0 sccm and approximately 1000 sccm;
    creating a second high-density plasma; wherein the IPVD system comprises an inductively coupled plasma (ICP) source coupled to the processing chamber using an antenna, the ICP source operating at a second ICP power ranging from approximately 5000 watts to approximately 5500 watts, and operating at a second ICP frequency between approximately 1 MHz and 100 MHz;
    providing a second target power to a Tantalum (Ta) target positioned within the processing chamber, wherein the IPVD system further comprises a target power source coupled to the Ta target, the second target power being between approximately 1500 watts and approximately 1900 watts;

providing a second RF substrate bias power to an electrode in the temperature-controlled substrate holder, the second RF substrate bias power being between approximately 150 watts and approximately 250 watts;

flowing a Nitrogen-containing gas into the processing chamber at a second flow rate, wherein the second flow rate varies between approximately 10 sccm and approximately 30 sccm; and exposing the patterned substrate to the second high-density plasma during a first NND processing time.

7. The method as claimed in claim 6, wherein the second TaN layer thickness is less than approximately two nanometers.

8. The method as claimed in claim 6, wherein the temperature-controlled substrate holder is vertically translated to establish a second gap between the Ta target and the patterned substrate, and the second gap varies from approximately 150 mm to approximately 300 mm.

9. The method as claimed in claim 6, wherein the first NND processing time comprises at least two cycles having second durations of approximately 1.9 seconds.

10. The method as claimed in claim 1, where the second LND procedure further comprises:

establishing a third temperature for the temperature-controlled substrate holder, the third temperature being below zero degrees Celsius;

establishing a third pressure within the processing chamber, wherein the third pressure is between approximately 50 mTorr and approximately 150 mTorr;

flowing an inert gas into the processing chamber at a third inert gas flow rate, the IPVD system comprising a gas supply system coupled to the processing chamber, wherein the third inert gas flow rate varies between approximately 0 sccm and approximately 1000 sccm;

creating a third high-density plasma; wherein the IPVD system comprises an inductively coupled plasma (ICP) source coupled to the processing chamber using an antenna, the ICP source operating at a third ICP power ranging from approximately 5000 watts to approximately 5500 watts, and operating at a third ICP frequency between approximately 1 MHz and 100 MHz;

providing a third target power to a Tantalum (Ta) target positioned within the processing chamber, wherein the IPVD system further comprises a target power source coupled to the Ta target, the third target power being between approximately 1500 watts and approximately 1900 watts;

providing a third RF substrate bias power to an electrode in the temperature-controlled substrate holder, the third RF substrate bias power being between approximately 150 watts and approximately 250 watts;

flowing a Nitrogen-containing gas into the processing chamber at a second flow rate, wherein the second flow rate varies between approximately 10 sccm and approximately 30 sccm; and exposing the patterned substrate to the third high-density plasma during a second LND processing time.

11. The method as claimed in claim 10, wherein the third TaN layer thickness is less than approximately three nanometers.

12. The method as claimed in claim 10, wherein the temperature-controlled substrate holder is vertically translated to establish a third gap between the Ta target and the patterned substrate, and the third gap varies from approximately 150 mm to approximately 300 mm.

13. The method as claimed in claim 10, wherein the second LND processing time comprises at least two cycles having first durations of approximately 14.9 seconds.

14. The method as claimed in claim 1, where the second NND procedure further comprises:

establishing a fourth temperature for the temperature-controlled substrate holder, the fourth temperature being below zero degrees Celsius;

establishing a fourth pressure within the processing chamber, wherein the fourth pressure is between approximately 50 mTorr and approximately 150 mTorr;

flowing an inert gas into the processing chamber at a fourth inert gas flow rate, the IPVD system comprising a gas supply system coupled to the processing chamber, wherein the fourth inert gas flow rate varies between approximately 0 sccm and approximately 1000 sccm;

creating a fourth high-density plasma; wherein the IPVD system comprises an inductively coupled plasma (ICP) source coupled to the processing chamber using an antenna, the ICP source operating at a fourth ICP power ranging from approximately 5000 watts to approximately 5500 watts, and operating at a fourth ICP frequency between approximately 1 MHz and 100 MHz;

providing a fourth target power to a Tantalum (Ta) target positioned within the processing chamber, wherein the IPVD system further comprises a target power source coupled to the Ta target, the fourth target power being between approximately 1500 watts and approximately 1900 watts;

providing a fourth RF substrate bias power to an electrode in the temperature-controlled substrate holder, the fourth RF substrate bias power being between approximately 150 watts and approximately 250 watts;

flowing a Nitrogen-containing gas into the processing chamber at a fourth flow rate, wherein the fourth flow rate varies between approximately 10 sccm and approximately 30 sccm; and exposing the patterned substrate to the fourth high-density plasma during a second NND processing time.

15. The method as claimed in claim 14, wherein the fourth TaN layer thickness is less than approximately three nanometers.

16. The method as claimed in claim 14, wherein the temperature-controlled substrate holder is vertically translated to establish a fourth gap between the Ta target and the patterned substrate, and the fourth gap varies from approximately 150 mm to approximately 300 mm.

17. The method as claimed in claim 14, wherein the second NND processing time comprises at least two cycles having fourth durations of approximately 1.9 seconds.

18. The method as claimed in claim 2, wherein a first LND deposition rate is established during the first LND processing time, the first LND deposition rate comprising a first LND field deposition rate, a first LND sidewall deposition rate, or a first LND bottom surface deposition rate, or a combination thereof, the first LND field deposition rate varies from approximately −10 nm/min to approximately +20 nm/min, the first LND bottom surface deposition rate varies from approximately −5 nm/min to approximately +5 nm/min, and the first LND sidewall deposition rate varies from approximately −2 nm/min to approximately +10 nm/min.

19. The method as claimed in claim 6, wherein a first NND deposition rate is established during the first NND processing time, the first NND deposition rate comprising a first NND field deposition rate, a first NND sidewall deposition rate, or a first NND bottom surface deposition rate, or a combination thereof, the first NND field deposition rate varies from approximately −10 nm/min to approximately +20 nm/min, the first NND bottom surface deposition rate varies from approximately −5 nm/min to approximately +5 nm/min, and the first NND sidewall deposition rate varies from approximately −2 nm/min to approximately +10 nm/min.

20. The method as claimed in claim 1, wherein the barrier layer comprises a specific resistivity that is less than 22 microohms-cm$^{-3}$.

* * * * *